US006452517B1

(12) United States Patent
Vinitzky

(10) Patent No.: US 6,452,517 B1
(45) Date of Patent: Sep. 17, 2002

(54) DSP FOR TWO CLOCK CYCLE CODEBOOK SEARCH

(75) Inventor: Gil Vinitzky, Azur (IL)

(73) Assignee: DSP Group Ltd., Herzliya (IL)

(*) Notice: Subject to any disclaimer, the term of this patent is extended or adjusted under 35 U.S.C. 154(b) by 0 days.

(21) Appl. No.: 09/368,317

(22) Filed: Aug. 3, 1999

(51) Int. Cl.[7] .................................................. H03M 7/00
(52) U.S. Cl. ........................................ 341/106; 704/200
(58) Field of Search .......................... 341/106; 704/200, 704/224; 708/207

(56) References Cited

U.S. PATENT DOCUMENTS 5,726,923 A * 3/1998 Okumura et al. ...... 364/715.06
5,752,223 A * 5/1998 Aoyagi et al. .............. 704/219
5,784,532 A * 7/1998 McDonough et al. ...... 395/2.31
5,926,786 A * 7/1999 McDonough et al. ....... 704/224

OTHER PUBLICATIONS

Texas Instruments Incorporated of Dallas, Texas, USA, *TMS320C54xPreliminary User's Guide*, Chapter 12, section 10.3, 1995.

* cited by examiner

*Primary Examiner*—Peguy JeanPierre
(74) *Attorney, Agent, or Firm*—Eitan, Pearl, Latzer, Cohen-Zedek

(57) ABSTRACT

A device for performing a search for the optimum code vector in a codebook having N code vectors indexed by i has a controller which considers each ith code vector, and a processor which determines in two clock cycles whether said ith code vector is the current optimal code vector.

12 Claims, 7 Drawing Sheets

DSP FOR TWO CLOCK CYCLE CODEBOOK SEARCH

FIELD OF THE INVENTION

The present invention relates to digital signal processing (DSP) in general, and speech coding using DSP in particular.

BACKGROUND OF THE INVENTION

A DSP (digital signal processor) is a processor that has a special architecture so that serial processes, namely multiply and accumulate, are faster than those same processes in other processors, such as a CPU (central processing unit). Digital signal processors are used in applications such as cellular phones, fax machines and modems. The architecture of different digital signal processors is customized for use in a particular application. The application includes a software program that calls the specific commands of a particular DSP.

One of the applications for which a DSP could be used is speech coding, in which an analog speech signal is converted to a compressed digital signal. There are several speech-coding techniques available. The technique of code-excited linear predictive (CELP) speech coding is well known in the art, as discussed in the chapter 12, section 10.3 of the *TMS*320C54*x Preliminary User's Guide* from Texas Instruments Incorporated of Dallas, *Texas*, USA.

Reference is now made to FIG. 1, which is a schematic block diagram illustration of a prior art CELP-based speech coder. An input speech signal 10 is compared to predetermined, compressed digital signals, which are stored in a dynamic array, known as a codebook 12. The codebook 12 can be likened to dictionary of sounds, where each sound is digitized, compressed and stored as a code vector 14. The optimum vector 16, which best matches the input speech signal 10 according to a certain criterion, is selected in what is known as a "codebook search". An application using the CELP speech coding technique then transmits the compressed digital signal of the optimum vector 16 instead of the input analog speech signal 10.

Samples of a subframe of the input speech signal 10 are passed through a weighting filter 18, thereby producing N weighted input speech samples p(n), n=0, . . . , N−1, where N is the number of samples in the subframe.

In order that the transmitted signal sound as close as possible to real speech, the signal transmitted is actually an amplified, weighted, and synthesized version of the optimum vector 16. It is customary in the art to represent the codebook 12 by a collection of shape vectors $s_i$ (n) and a collection of gain factors $g_j$, where i is the index of the shape vector and j is the index of the gain factor in the codebook 12. Prior to comparison with p(n), the shape vector $s_i$ (n) is passed through the amplifier 20, and then through a synthesis and weighting filter 22, the output of which is $g_j v_i(n)$, where $g_j$ is the $j^{th}$ gain factor, and $v_i(n)$ is the weighted, synthesized version of the shape vector $s_i(n)$.

When p(n) is compared to $g_j v_i(n)$, then the error in substituting the amplified, weighted, synthesized code vector for the input speech is minimized for the optimum vector 16 which maximizes the expression given in Equation (1):

$$c_i^2/G_i, \tag{1}$$

where $c_i$ is a cross-correlation variable of the weighted, synthesized code vector with the weighted input speech, given by $$c_i = \sum_{n=0}^{N-1} p(n)\cdot v_i(n),$$

and $G_i$ is an energy variable given by $$G_i = \sum_{n=0}^{N-1} v_i^2(n).$$

Then for the optimum vector 16 whose index i has the value opt, the gain factor is given by $$g_{opt} = \sum_{n=0}^{N-1} p(n)\cdot v_{opt}(n) \Big/ \sum_{n=0}^{N-1} v_{opt}^2(n).$$

The criterion for choosing the optimum vector 16 can be written as in Equation 2:

$$c_i^2\cdot G_{opt} \leqq e_{opt}^2\cdot G_i, \tag{2}$$

where $c_i$ and $c_{opt}$ are the cross-correlation variables of the $i^{th}$ code vector and the optimum vector 16, respectively, with the weighted input speech, and $G_i$ and $G_{opt}$ are the energy variables of the $i^{th}$ code vector and the optimum vector 16, respectively. The variables $c_i^2$ and $G_i$ are the parameters of the $i^{th}$ code vector upon which a 1-dimensional codebook search is based.

Reference is now made to FIG. 2, which is a schematic flowchart illustration of a prior art method for a standard codebook search, to be used with any processor. In the initialization step 100, the index i in the codebook is set to 1, $c_{opt}^2$ is set to $c_0^2$, $G_{opt}$ is set to $G_0$, and the index opt of the optimum vector is set to 0. Then a loop 102 of the codebook search begins. There are three multiplication steps: $G_i$ by $c_{opt}^2$ (step 104), then $c_i$ by $c_i$ (step 106), then $c_i^2$ by $G_{opt}$ (step 108). Then there is an accumulation step, in which $c_{opt}^2\cdot G_i$ is subtracted (step 110) from $c_i^2\cdot G_{opt}$. The condition $c_i^2\cdot G_{opt}-c_{opt}^2\cdot G_i \leqq 0$ is tested (step 112), and if satisfied, then a new optimum vector has been found, and an inner loop 114 entered. In that case, the index opt is set (step 116) to the current value of i, the value $c^{i2}$ is stored (step 118) as the new $c_{opt}^2$, and the value $G_i$ is stored (step 120) as the new $G_{opt}$. Note that the inner loop 114 is executed only when a new optimum vector has been found. When the inner loop 114 is completed, or when the condition $c_i^2\cdot G_{opt}-c_{opt}^2\cdot G_i \leqq 0$ of step 112 is not satisfied, then it is checked (step 122) whether the index i is the last index of the codebook. If it is, then loop 102 is exited, and the optimum vector has the index opt. If the index i is not the last index of the codebook, then the index i is moved (step 124) to the next vector in the codebook before the loop 102 is resumed.

As described hereinabove, the method shown in FIG. 2 is appropriate for a 1-dimensional codebook search, in which the application performing the codebook search uses the following method:

```
Repeat {
  codebook search on code vector i
}
```

However, the method shown in FIG. 2 is also appropriate for 2-dimensional codebook searches, in which the application performing the codebook search uses the following method:

Block Repeat {
  various other calculations
  codebook search on code vector i
} where the various other calculations are shown as step 126 in FIG. 2. In the case of a 2-dimensional codebook search, the output of the various other calculations are used in place of the parameters $c_i$ and $G_i$.

In a typical DSP with one multiplier and one arithmetic logic unit (ALU), the method of loop 102, schematically illustrated in FIG. 2, would require at least four clock cycles, and as many as eight clock cycles if a new optimum vector were found. In a DSP with two multipliers and one ALU, the method of loop 102, would require at least three clock cycles, and as many as seven clock cycles if a new optimum vector were found.

SUMMARY OF THE INVENTION

An object of the present invention is to provide a digital signal processor (DSP) capable of executing codebook searches, such that the calculation and comparison for each code vector takes two clock cycles only.

There is therefore provided in accordance with a preferred embodiment of the present invention a device for performing a search for the optimum code vector in a codebook having N code vectors indexed by i. The device includes a controller which considers each ith code vector, and a processor which determines in two clock cycles whether the ith code vector is the current optimal code vector.

Moreover, in accordance with a preferred embodiment of the present invention, the processor includes an arithmetic logic unit, and two multipliers.

Furthermore, in accordance with a preferred embodiment of the present invention, the processor further includes a register for storing half of the product of one of the two multipliers.

Additionally, in accordance with a preferred embodiment of the present invention, the processor includes first clock cycle means for generating a first product whose high part is a first parameter of the ith code vector, and if a second product is greater than a third product for the (i−1)th code vector, for setting the (i−1)th code vector to be a currently optimal code vector. The processor also includes second clock cycle means for generating the second product of the first parameter of the ith code vector and a second parameter of the currently optimal code vector and the third product of a first parameter of the currently optimal code vector and a second parameter of the ith code vector.

Moreover, in accordance with a preferred embodiment of the present invention, the processor further includes means for normalizing the second product and the third product for the ith code vector. This normalization is performed after the second product and the third product for the ith code vector are generated by the second clock cycle means and before the second product and the third product for the ith code vector are compared by the first clock cycle means.

There is also provided in accordance with a preferred embodiment of the present invention a method for selecting the optimum code vector of a codebook having N code vectors indexed by i, each characterized by a first and second parameter. For each ith code vector, the method includes a first clock cycle step and a second clock cycle step. The first clock cycle step is the step of generating a first product whose high part is the first parameter of the ith code vector, and if a second product is greater than a third product for the (i−1)th code vector, setting the ((i−1)th code vector to be a currently optimal code vector. The second clock cycle step is the step of generating the second product of the first parameter of the ith code vector and a second parameter of the currently optimal code vector and the third product of a first parameter of the currently optimal code vector and a second parameter of the ith code vector.

Moreover, in accordance with a preferred embodiment of the present invention, the method further includes the step of for each ith code vector, normalizing the second product and the third product for the ith code vector after the second clock cycle for the ith code vector and before the first clock cycle for the (i+1)th code vector.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

The present invention describes a digital signal processor (DSP) whose architecture is customized to use a novel method for a codebook search, in which the calculation and comparison for each code vector requires two clock cycles only.

Figure 1:
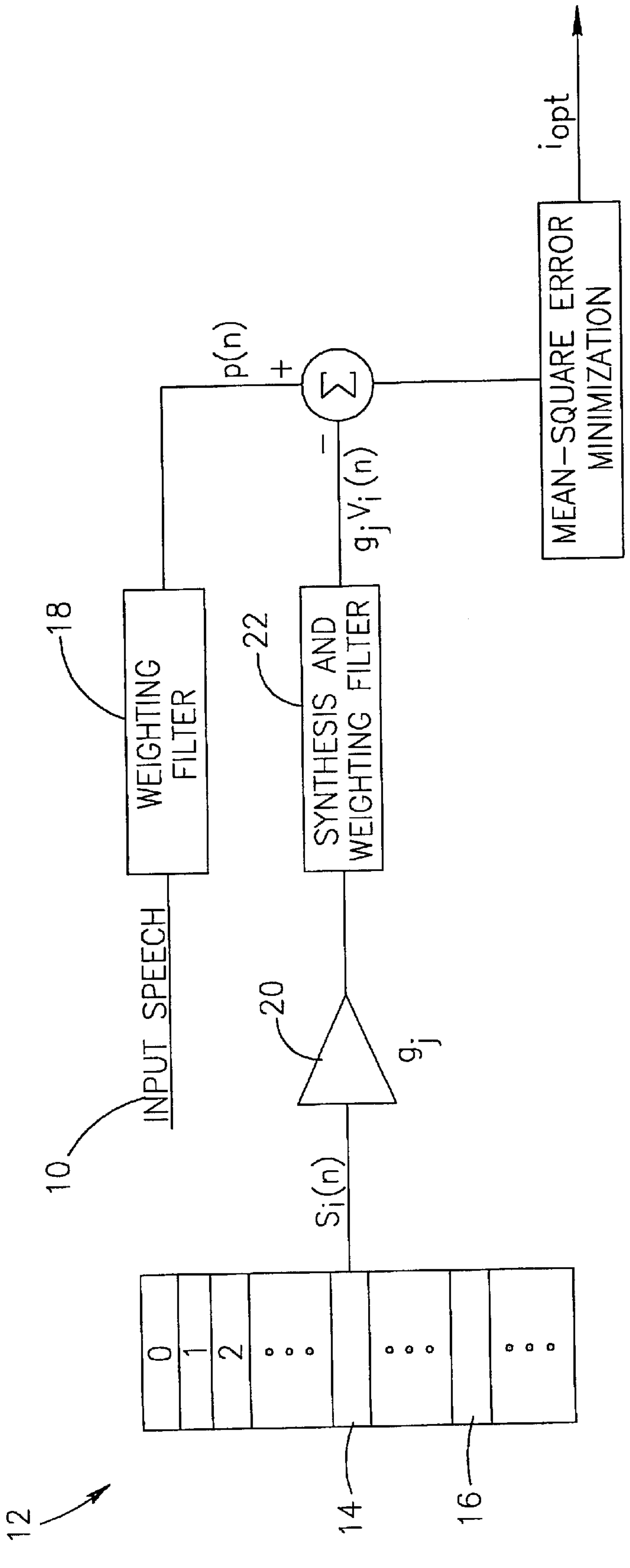
FIG.1 PRIOR ART
FIG. 1 is a schematic block diagram illustration of a prior art code-excited linear predictive (CELP) speech coder.
Figure 2:
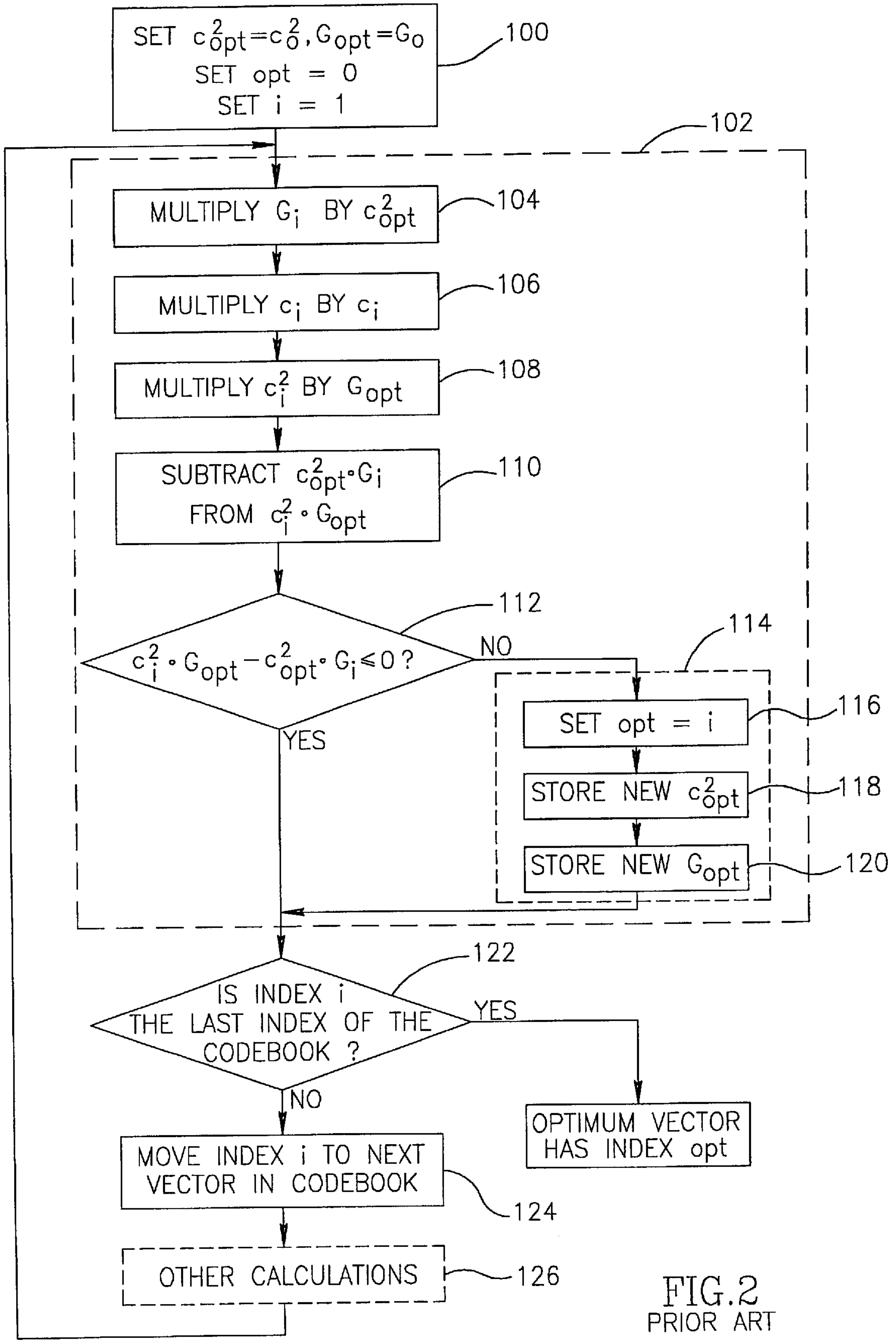
FIG.2 PRIOR ART
FIG. 2 is a schematic flowchart illustration of a prior art method for a standard codebook search.

A DSP typically has one multiplier and a single arithmetic logic unit (ALU). It will be appreciated that since the codebook search calculation for each code vector requires three actions of multiplication ($G_i$ by $c_{opt}^2$ (step 104 of FIG. 2), $c_i$ by $c_i$ (step 106), and $c_i^2$ by $G_{opt}$ (step 108)), one of which uses the output of a previous multiplication, even a DSP with two multipliers would require at least two clock cycles in order to perform the calculation. The present invention accomplishes the calculation and comparison in two clock cycles, even in the case that a new optimum vector has been found. This accomplishment is significant for two reasons: it reduces the number of clock cycles needed, thereby allowing applications doing a codebook search to work more quickly; and it provides a consistent MIPS (million instructions per second) performance to the application.

Figure 3:
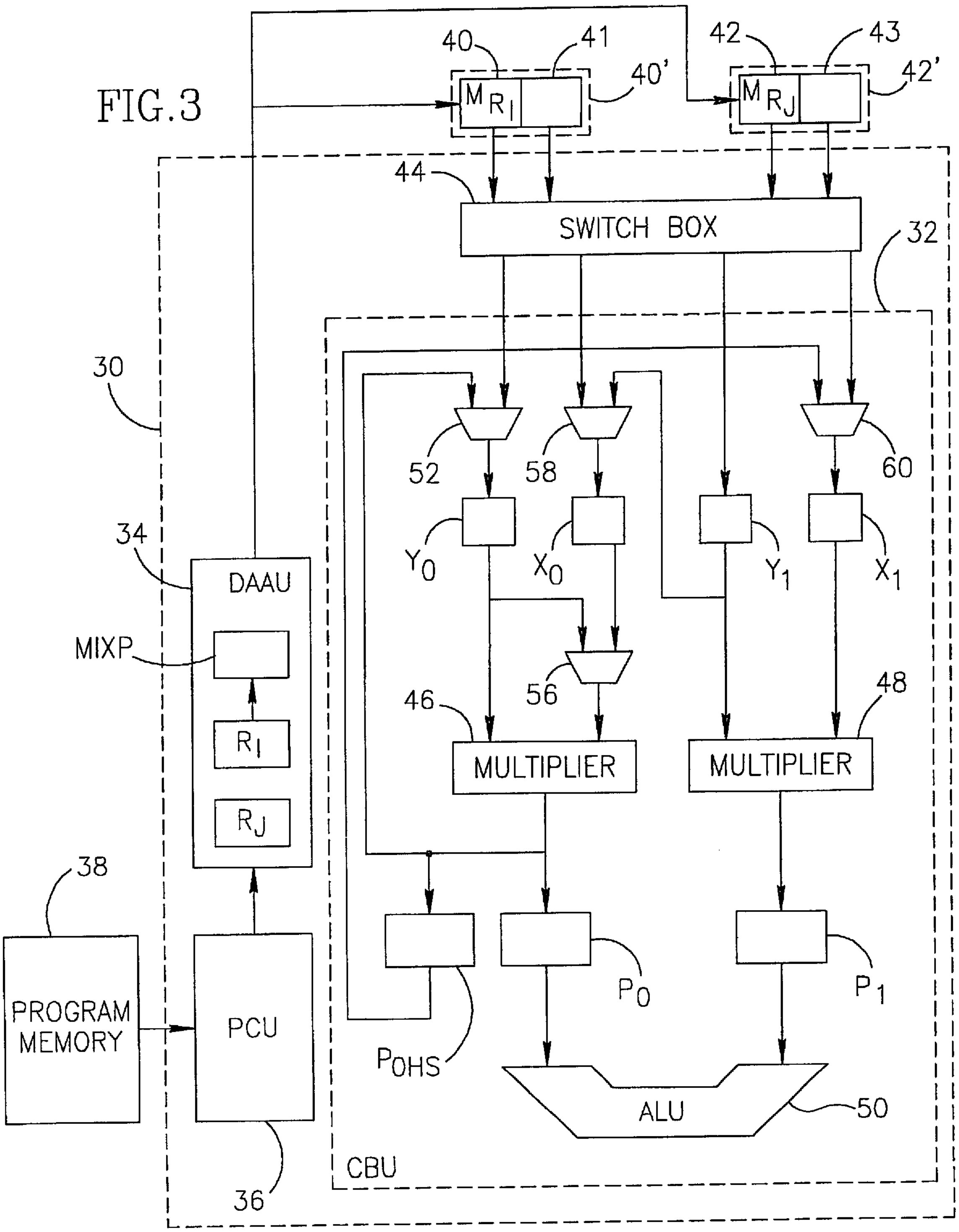
FIG. 3 is a schematic block diagram illustration of the architecture of a digital signal processor (DSP) according to a preferred embodiment of the present invention.

Reference is now made to FIG. 3, which is a schematic block diagram of the architecture of a DSP 30 according to a preferred embodiment of the present invention. The DSP 30 comprises a computational bit manipulation unit (CBU)

32, a data address arithmetic unit (DAAU) 34, a program control unit (PCU) 36 and a switch box 44.

In operation, the PCU 36 controls the DAAU 34 and the CBU 32 according to the application's program, which is stored in a program memory 38. The DMU 34 comprises two registers $R_I$ and $R_J$ for storing the addresses of memory blocks 40 and 42 and a register MIXP for storing the address of the optimum code vector. Memory block 41 is the next block after memory block 40, and memory block 43 is the next block after memory block 42. The PCU 36 provides the addresses of memory blocks 40 and 42 to registers $R_I$ and $R_J$, respectively. The DAAU 34 provides memory blocks 40 and 42 with the addresses stored in registers $R_I$ and $R_J$. The switch box 44 accesses the word size memory blocks 40, 41, 42 and 43 and provides the data stored therein to the CBU 32 for computation.

The CBU 32 comprises two multipliers 46 and 48, and two registers $P_0$ and $P_1$ for storing the output of the multipliers 46 and 48, respectively. The CBU 32 further comprises four registers $X_0$, $X_1$, $Y_0$ and $Y_1$ for storing the input to the multipliers 46 and 48, and an arithmetic logic unit (ALU) 50, whose input is taken from registers $P_0$ and $P_1$.

The switch box 44 accesses the memory blocks 41, 42, 43 and 44 and copies their data to registers $X_0$, $X_1$, $Y_0$ and $Y_1$. Note that since the registers $X_0$, $X_1$, $Y_0$ and $Y_1$ are each of word size, registers $P_0$ and $P_1$ are each of double word size. Each register $P_0$ and $P_1$ has a word size high part and a word size low part. There is an additional word size register $P_{OSH}$ for storing the high part of $P_0$.

The CBU 32 also comprises four multiplexers 52, 56, 58 and 60 for selecting the data to be stored in registers $X_0$, $X_1$ and $Y_0$ and to be provided to multiplier 46.

It will be appreciated by those skilled in the art that alternate hardware architectures of the DSP 30, in which the number and placement of the components differs from that described hereinabove, are with in the scope of the present invention. For example, the memory blocks 40 and 41 may be a single memory block 40' of double word size, and the memory blocks 42 and 43 may be a single memory block 42' of double word size. As another example, there may be no switch box 44 in the DSP 30, in which case the memory blocks are accessed directly by the CBU 32. In a further example, the output of the multipliers 46 and 48 may be stored in an accumulator register file instead of in the registers $P_0$ and $P_1$, respectively.

Figure 4:
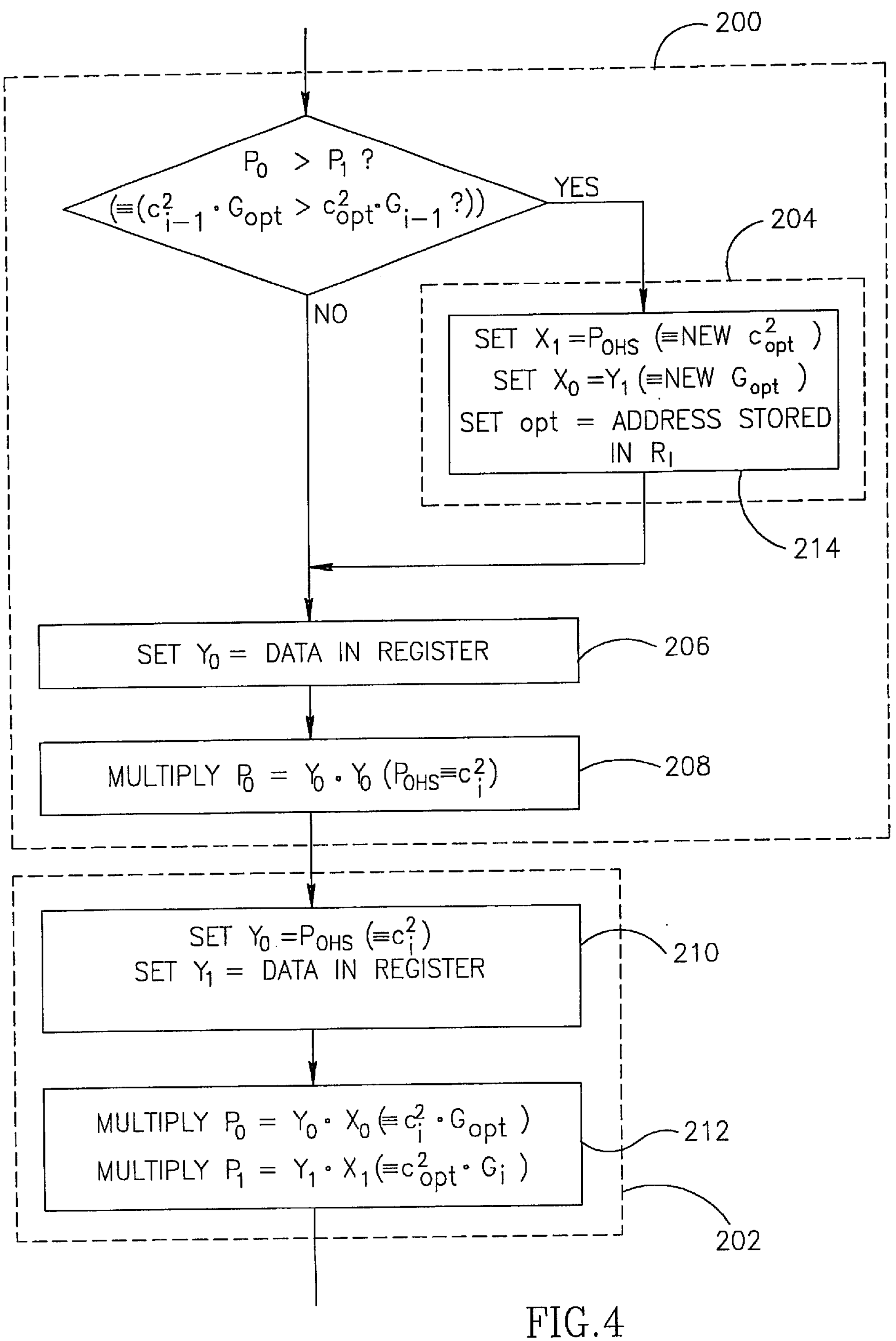
FIG. 4 is a schematic flowchart illustration of an method for a codebook search, operative according to a preferred embodiment of the present invention.

Reference is now made additionally to FIG. 4, which is a schematic flowchart illustration of an method for a codebook search, according to a preferred embodiment of the present invention. It is assumed that the cross-correlation and energy variables $c_i$ and $G_i$ for each code vector in the codebook are already available in memory. The calculation and comparison for each code vector requires precisely two clock cycles, a first clock cycle 200 and a second clock cycle 202. The first clock cycle has an inner loop 204 which is executed when a new optimum vector has been found.

The codebook search method of FIG. 4 can be used in many different situations, including a 1-dimensional codebook search and a 2-dimensional codebook search. In the case of a 2-dimensional codebook search, various preparatory calculations are performed and the results are stored in the output registers of the ALU 50. Afterwards, the results are used as inputs to the codebook search in place of the cross-correlation and energy variables $c_i$ and $G_i$. In another example, the products that calculated by the multipliers 46 and 48 are normalized before comparison.

Figure 5:
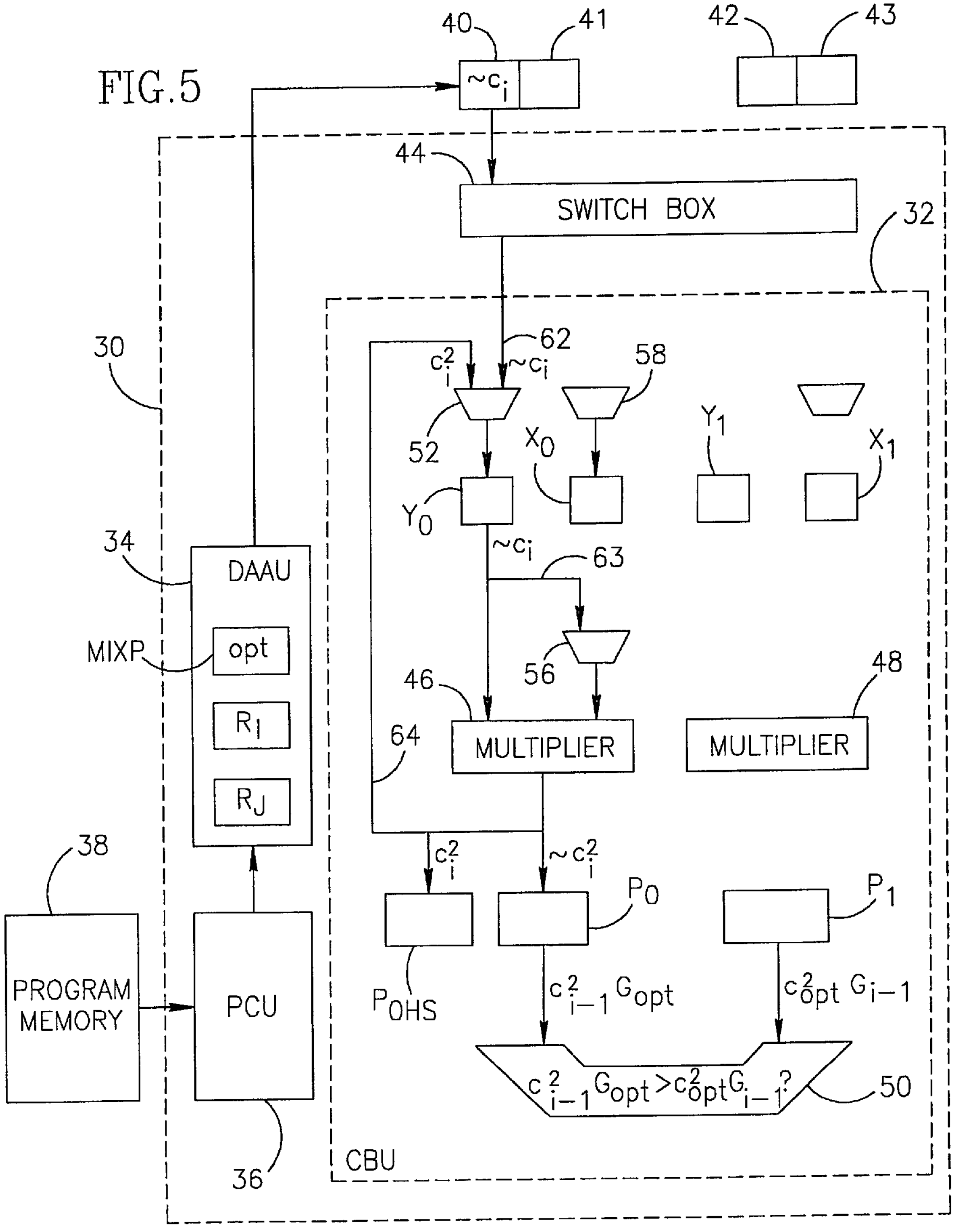
FIG. 5 is a schematic block diagram of the architecture of the DSP of FIG. 3, showing the data flow during the first clock cycle of the method of FIG. 4, with out the inner loop.

Reference is made additionally to FIG. 5, which is a schematic block diagram of the architecture of the DSP of FIG. 3, showing the data flow during the first clock cycle of the method of FIG. 4, with out the inner loop. The first clock cycle 200 begins with a comparison of the contents of registers $P_0$ and $P_1$. If $P_0$ is greater than $P_1$, which is equivalent to saying that $c_i^2 \cdot G_{opt}$ is greater than $c_{opt}^2 \cdot G_i$, then a new optimum vector has been found, and the inner loop 204, which will be described in more detail hereinbelow, is executed. The next step 206 is to set the value of register $Y_0$ to the contents of a register. In the case of a 1-dimensional codebook search, the value of register $Y_0$ is set to the contents of the memory block whose address is stored in register $R_I$, the contents designated ~$c_i$ to indicate that they are related to the cross-correlation variable $c_i$. This is shown in FIG. 5 by the line 62 from the switch box 44 to the multiplexer 52 which feeds register $Y_0$. In the case of a 2-dimensional codebook search, the value of register $Y_0$ is set to the contents of one of the output registers (not shown) of the ALU 50.

Then in step 208, the contents of register $Y_0$ are fed into the multiplexer 56 which feeds the multiplier 46, as shown in FIG. 5 by the line 63, and the product of the multiplication is fed into register $P_0$. The high part of the product, equivalent to $c_i^2$, is fed simultaneously into register $P_{OSH}$ and multiplexer 52, which feeds register $Y_0$, as shown by the line 64 from the output of the multiplier 46 to the multiplexer 52.

Figure 6:
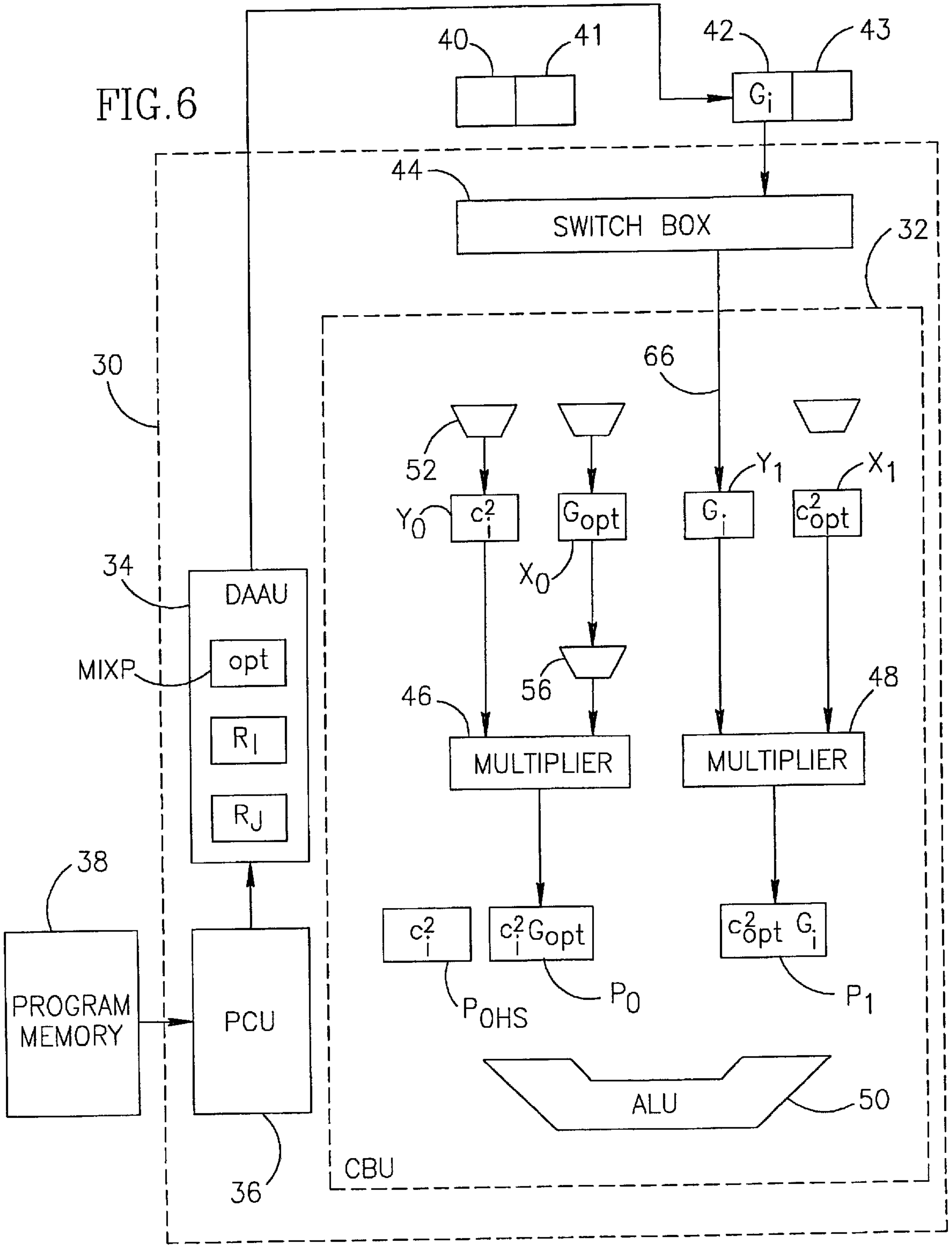
FIG. 6 is a schematic block diagram of the architecture of the DSP of FIG. 3, showing the data flow during the second clock cycle of the method of FIG. 4.

Reference is now made additionally to FIG. 6, which is a schematic block diagram of the architecture of the DSP of FIG. 3, showing the data flow during the second clock cycle of the method of FIG. 4. The first step 210 of the second clock cycle 202 sets the value of register $Y_0$ to the contents of multiplexer 52, so that register $Y_0$ has the value $c_i^2$. Step 210 also sets the value of register $Y_1$ to the contents of a register. In the case of a 1-dimensional codebook search, the value of register $Y_1$ is set to the contents of the memory block whose address is stored in register $R_J$, whose value is $G_i$. This is shown in FIG. 6 by the line 66 from the switch box 44 directly to register $Y_1$. Registers $X_0$ and $X_1$ already have the values $G_{opt}$, and $c_{opt}^2$, respectively, as will be explained below with reference to FIG. 7. In the case of a 2-dimensional codebook search, the value of register $Y_1$ is set to the contents of one of the output registers (not shown) of the ALU 50.

During the second step 212 of the second clock cycle 202, both multipliers 46 and 48 execute multiplication. Multiplier 46 multiplies the values of registers $Y_0$ and $X_0$, and the product, which is equivalent to $c_i^2 \cdot G_{opt}$, is fed into register $P_0$. Multiplier 48 multiplies the values of registers $X_1$ and $Y_1$, and the product, which is equivalent to $c_{opt}^2 \cdot G_i$, is fed into register $P_1$.

Figure 7:
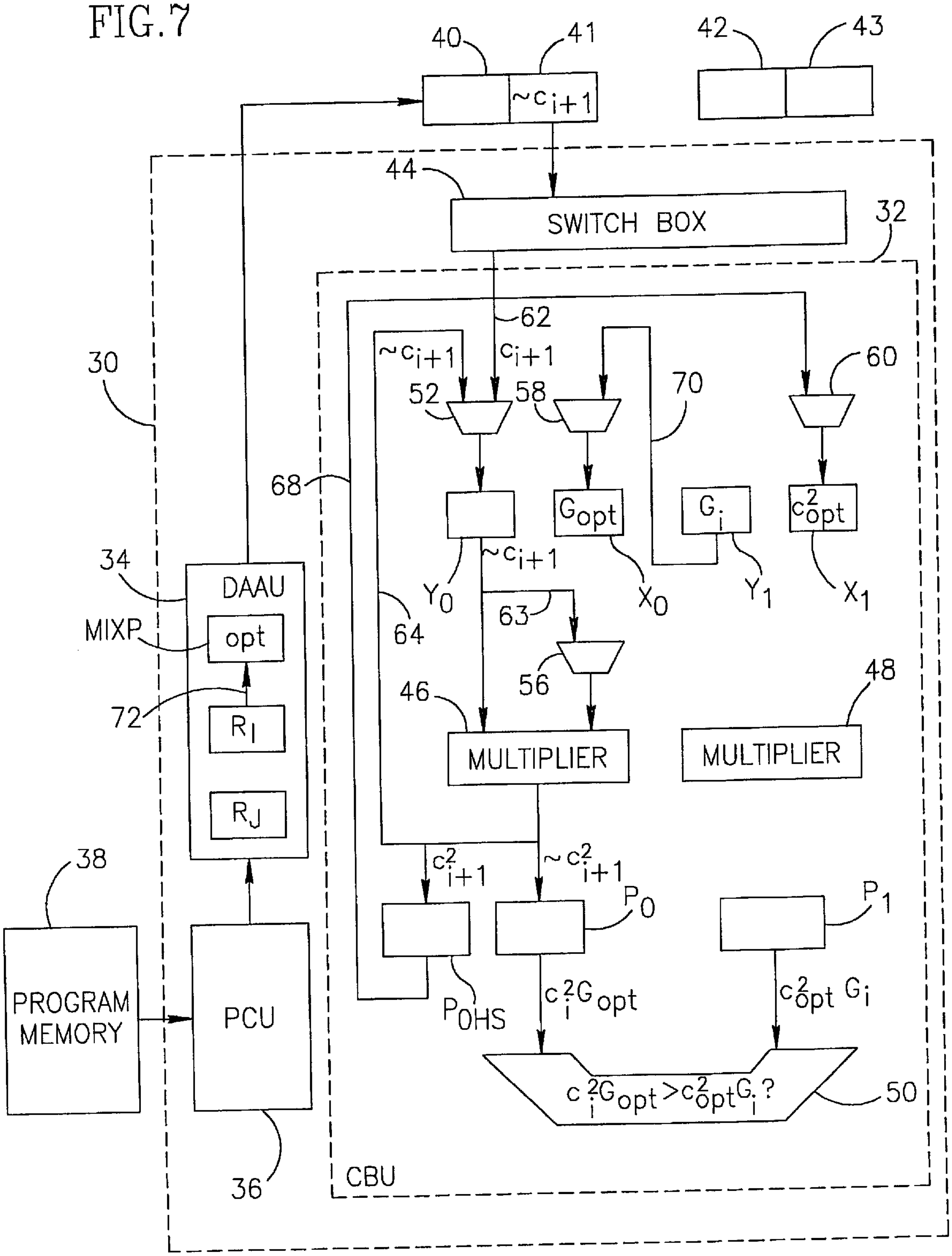
FIG. 7 is a schematic block diagram of the architecture of the DSP of FIG. 3, showing the data flow during the first clock cycle of the method of FIG. 4, with the inner loop.

Reference is now made additionally to FIG. 7, which is a schematic block diagram of the architecture of the DSP of FIG. 3, showing the data flow during the first clock cycle of the method of FIG. 4, with the inner loop. The first clock cycle 200 begins with a comparison of the contents of registers $P_0$ and $P_1$. If $P_0$ is greater than $P_1$, which is equivalent to saying that $c_i^2 \cdot G_{opt}$ is greater than $c_{opt}^2 \cdot G_1$, then a new optimum vector has been found, and the inner loop 204 is executed. The inner loop 204 of the first clock cycle 200 consists of only one step 214, in which the value of register $X_1$ is set to the contents of register $P_{OHS}$, which becomes the new $c_{opt}^2$. This is shown in FIG. 7 by the line 68 from register $P_{OHS}$ to the multiplexer 60 which feeds register $X_1$. Furthermore, the value of register $X_0$ is set to the contents of register $Y_1$, which becomes the new $G_{opt}$. This is shown in FIG. 7 by the line 70 from register $Y_1$ to the multiplexer 58 which feeds register $X_0$. Finally, the address stored in register $R_I$ is stored in register MIXP as the index of the new optimum vector, as shown in FIG. 7 by the line 72.

The next step 206 is to set the value of register $Y_0$ to the contents of the memory block whose address is stored in register $R_I$, the contents designated~$c_i$ to indicate that they are related to the cross-correlation variable $c_i$. This is shown in FIG. 7 by the line 62 from the switch box 44 to the multiplexer 52 which feeds register $Y_0$. It will be appreciated that since both step 206 and step 214 involve setting values of registers, they can be performed in parallel at the same stage of the first clock cycle 200.

Then in step 208, the contents of register $Y_0$ are fed into the multiplexer 56 which feeds the multiplier 46, as shown in FIG. 7 by the line 63, and the product of the multiplication is fed into register $P_0$. The high part of the product, equivalent to $c_i^2$, is fed simultaneously into register $P_{OHS}$ and multiplexer 52, which feeds register $Y_0$, as shown by the line 64 from the output of the multiplier 46 to the multiplexer 52.

An application such as GSM (Global System for Mobile communications) spends approximately 30% of its time doing codebook searches. If a GSM application has approximately 70–100 MIPS, then 2–33 MIPS of it is used for codebook searches. As explained hereinabove, a prior art codebook search requires approximately six clock cycles per code vector, whereas the codebook search of the present invention requires precisely two clock cycles per code vector. Therefore, by using the codebook search of the present invention, a GSM application can reduce the MIPS used for codebook searches to approximately 7–11 MIPS, for a total application MIPS of 56–58, which is a saving of approximately 20% in time.

It will be appreciated by persons skilled in the art that the present invention is not limited by what has been particularly shown and described herein above.

Rather the scope of the invention is defined by the claims that follow:

1. A device for performing a search for the optimum code vector in a codebook having N code vectors indexed by i, the device comprising:

a general purpose processor; and a controller which provides each ith code vector to said processor, wherein said processor determines in two clock cycles whether said ith code vector is a current optimal code vector.

2. A device according to claim 1, wherein said processor comprises:

an arithmetic logic unit; and at most two multiplier.

3. A device according to claim 2, wherein said processor further comprises a register able to store part of a product of one of said two multipliers.

4. The device of claim 2, wherein said arithmetic logic unit is coupled to said two multipliers so that output of said two multipliers is input to said arithmetic logic unit.

5. A device for performing a search for the optimum code vector in a codebook having N code vectors indexed by i, the device comprising:

a processor; and a controller which provides each ith code vector to said processor, wherein said processor comprises:

first clock cycle means for generating a first product whose high part is a first parameter of the ith code vector, and if a second product is greater than a third product for the (i–1)th code vector, for setting said (i–1)th code vector to be a currently optimal code vector; and second clock cycle means for generating said second product of said first parameter of said ith code vector and a second parameter of said currently optimal code vector and said third product of a first parameter of said currently optimal code vector and a second parameter of said ith code vector.

6. A device according to claim 5, wherein said processor further comprises:

means for normalizing said second quantity and said third quantity for said ith code vector after said second quantity and said third quantity for said ith code vector are generated by said second clock cycle means and before said second quantity and said third quantity for said ith code vector are compared by said first clock cycle means.

7. A method for selecting the optimum code vector of a codebook having code vectors indexed by i, each of said code vectors characterized by a first parameter and a second parameter, the method comprising:

for each ith code vector:

in a first clock cycle, generating a first quantity whose high part is said first parameter of the ith code vector, and if a second quantity is greater than a third quantity for an (i–1)th code vector, setting said (i–1)th code vector to be a currently optimal code vector; and in a second clock cycle, generating said second quantity and said third quantity, said second quantity being a product of said first parameter of said ith code vector and a second parameter of said currently optimal code vector, said third quantity being a product of a first parameter of said currently optimal code vector and a second parameter of said ith code vector.

8. A method according to claim 7, the method further comprising for each ith code vector:

normalizing said second quantity and said third quantity for said ith code vector after said second clock cycle for said ith code vector and before said first clock cycle for an (i+1)th code vector.

9. An apparatus comprising:

a general purpose processor which determines in two clock cycles whether a code vector of a codebook is a current optimal code vector.

10. The apparatus of claim 9, wherein said processor comprises:

an arithmetic logic unit; and at most two multipliers.

11. The apparatus of claim 10, wherein said arithmetic logic unit is coupled to said two multipliers so that output of said two multipliers is input to said arithmetic logic unit.

12. A method comprising:

determining with a general purpose processor in two clock cycles whether a code vector of a codebook is a current optimal code vector.

* * * * *